Nov. 5, 1963 L. J. WARGO 3,109,995
VOLTAGE TUNED OSCILLATOR
Filed Sept. 1, 1959
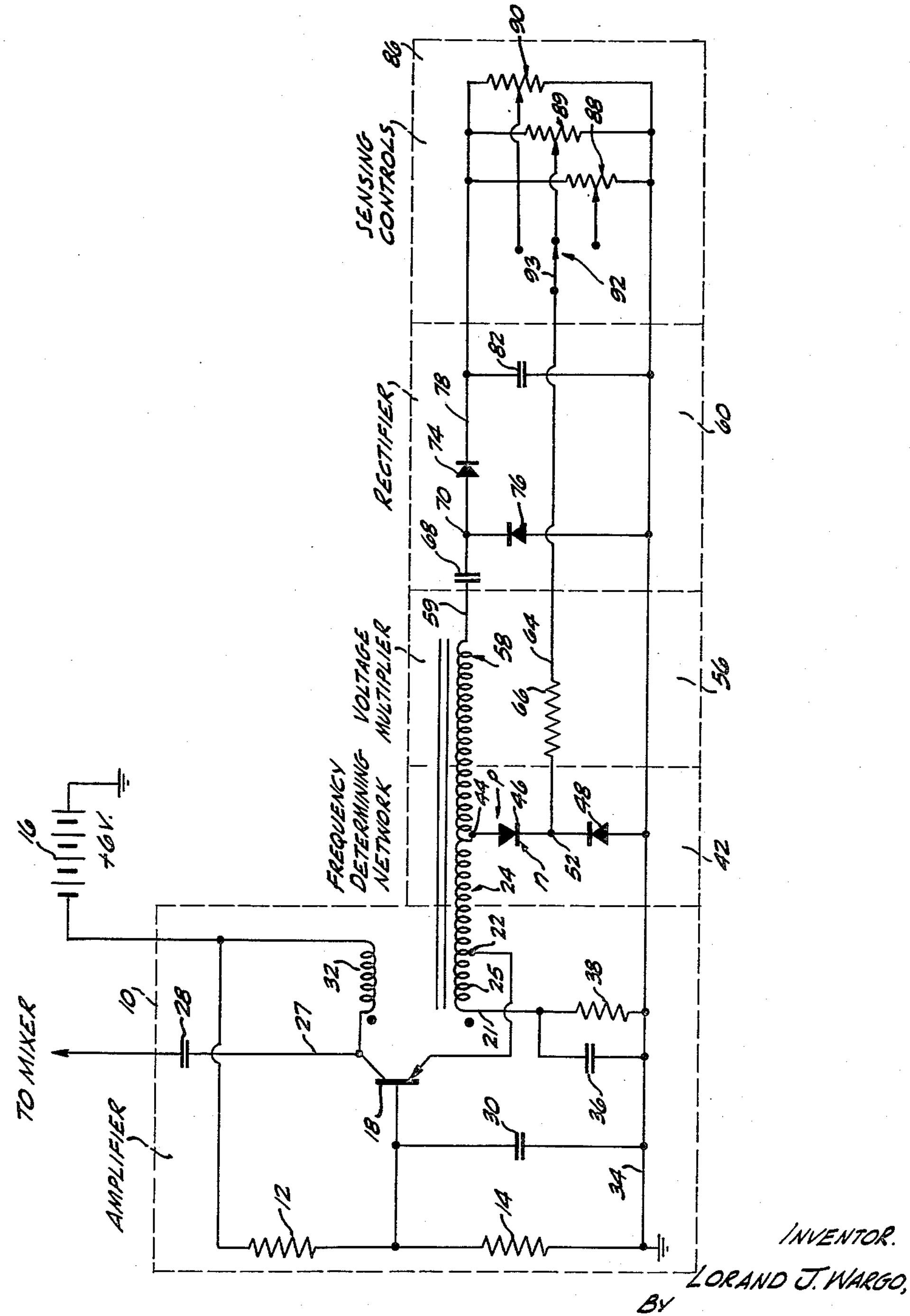
INVENTOR.
LORAND J. WARGO,
BY
Walter J. Adam
ATTORNEY 3,109,995
Patented Nov. 5, 1963

3,109,995

VOLTAGE TUNED OSCILLATOR

Lorand J. Wargo, Los Angeles, Calif., assignor to Hughes Aircraft Corporation, Culver City, Calif., a corporation of Delaware Filed Sept. 1, 1959, Ser. No. 837,420
3 Claims. (Cl. 331—117)

This invention relates to voltage tuned oscillator circuits and particularly to an oscillator utilizing diodes having nonlinear voltage variable capacitive characteristics.

Prior art oscillator circuits such as utilized in radio systems conventionally include a tuning capacitor having a plurality of plates controlled through a mechanical linkage from a tuning knob to change the frequency of the oscillatory wave. A more satisfactory means to provide a variable capacitance for tuning an oscillator is the use of an element such as a diode having nonlinear capacitance characteristics controlled by a voltage applied thereto. This means has the advantage that the capacitor may be tuned by remote control through wires without a complicated mechanical linkage. However, these diodes having nonlinear capacitive characteristics require a high voltage source to give sufficient capacitance variation to tune the resonant circuit over a wide range. Because of the self-biasing action in a resonant circuit, a high voltage must be applied to the diode elements to obtain a desired change of capacitance. As is well known, the voltage applied to a diode in a parallel or series-resonant circuit only changes the frequency as a factor of the fourth root of the voltage change. When utilizing transistors which conventionally require low voltage, a separate voltage source is required for tuning over the entire reception band. In mobile or portable equipment such as in pocket radios, for example, a separate battery or voltage source has the disadvantages of increasing the volume, weight and price of the radio and of increasing storage and service problems. An oscillator which is tunable over a wide frequency range and which could be utilized in transistor circuits with a single voltage source for all operations would be a great advance in the art.

It is therefore an object of this invention to provide an oscillator which includes a transistor as the active circuit element and is tunable over a wide range of frequencies from a single low voltage power source required with transistors.

It is a further object of this invention to provide a remote control oscillator circuit which will operate in a radio circuit utilizing a single power supply.

It is a still further object of this invention to provide an oscillator circuit having voltage variable capacitance elements and which utilizes the voltage of the local oscillator, multiplies it and feeds it back with a minimum of energy loss to the capacitance elements to control the oscillator frequency.

It is another object of this invention to provide an improved variable frequency oscillator which utilizes elements having voltage controlled capacitance characteristics for tuning and provides its own voltage multiplication so that a separate high voltage source is not required for tuning over a wide frequency band.

Briefly, in accordance with this invention there is provided a self-powered voltage tuned oscillator which utilizes diodes having nonlinear capacitance characteristics for tuning and which includes a voltage multiplier for developing a tuning voltage so that the oscillator requires only a single low voltage power source suitable for transistor circuits. The oscillator includes a conventional amplifier circuit utilizing transistors and a frequency-determining network including an inductor connected in parallel to a pair of diodes having nonlinear capacitance characteristics. The diodes are connected with such a polarity that their capacitance is effectively additive in series. The alternating output signal from the inductor is passed through a voltage multiplier inductor and a full wave rectifier or voltage doubler to a tuning control circuit. The voltage received from the frequency-determining network is thus an amplified or stepped-up D.C. (direct current) signal. The D.C. signal from the tuning control circuit is applied to a control point between the pair of tuning diodes as a reference level with a minimum of energy loss. Because of the arrangement of this oscillator having self-contained voltage amplification means, it is tunable over a wide frequency range from a single low voltage source conventionally utilized for the oscillator circuit as well as for other transistor circuitry coupled to the oscillator.

The novel features of this invention, as well as the invention itself, both as to its organization and method of operation, will best be understood from the following description, taken in conjunction with the accompanying drawing in which the single FIGURE is a schematic circuit diagram of the voltage tuned oscillator in accordance with this invention.

Referring to the drawing, an amplifier circuit 10 is provided which may be a conventional Class A amplifier utilized in a Hartley type oscillator circuit. The amplifier 10 includes a voltage divider network formed by resistors 12 and 14 connected in series to ground. The free end of the resistor 12 is connected to the negative terminal of a +6 volt battery 16 having its other terminal grounded. A transistor 18, which may be of the pnp type, has a base maintained at the potential developed between the resistors 12 and 14 and has an emitter connected to a tap 22 of an inductor or coil 24. The tap point 22 divides the coil 24 so as to provide an inductor or output coil portion 25. The transistor 18 has a collector connected to a lead 27 which may be coupled to a mixer circuit (not shown) through a D.C. blocking capacitor 28. The collector of the transistor 18 is also connected to the negative terminal of the battery 16 through an inductor or tickler coil 32.

It is to be noted that although the oscillator is shown passing a tuning signal to a mixer for heterodyning, the oscillator circuit of this invention has many other applications. A bypass capacitor 30 is connected between the base of the transistor 18 and a ground lead 34 to bypass radio frequency signals to ground. The tickler coil 32, which is connected between the battery 16 and the collector of the transistor 18, is mutually coupled to the coil 24 and an inductor or coil 58 to transfer energy thereto. The coil 32 is a tickler coil for feeding energy back to the resonant circuit of an oscillator, as is well known in the art. The coil 24 has one end connected to the ground lead 34 through a capacitor 36 and resistor 38 connected in parallel for biasing the coil and providing a by-pass to the ground lead 34 for high frequency signals. Output coil 25 being part of the coil 24 between the terminal 21 and tap point 22 applies an oscillating signal to the emitter of the transistor 18.

A frequency-determining network 42 is provided to control the amplifier circuit 10 and includes the inductor 24 connected between the terminal 21 and a tap point 44, and further includes a first diode 46 and a second diode 48 having their cathodes coupled to a junction point 52. The diode 46 has its anode connected to the tapping point 44 and the diode 48 has its anode connected to the ground lead 34. The diodes 46 and 48 have nonlinear capacitance characteristics which are voltage variable, thus providing a parallel resonant tuning circuit in combination with the inductor 24. The diodes 46 and 48 may be any of a plurality of known devices such as silicon capacitors manufactured by the Semiconductor Division, Hughes Products, Hughes Aircraft Company, of Newport Beach, California.

The diodes 46 and 48 are semiconductor diodes whose capacitance is varied by a variation in bias voltage applied thereto. As is well known, diodes of this type consist of a p zone having positive carriers corresponding to the anode end, an n zone having negative carriers corresponding to the cathode end, and a thin depletion zone or junction between the two other zones with relatively few carriers therein. The p and n zones are shown for the diode 46. When a potential is applied to one of these diodes which is positive at the anode end and negative at the cathode, carriers act to bridge the depletion zone to form a conducting path through the diode. When the applied potential is reversed, the depletion zone reappears and insulates the two zones of the diode from each other which is known as a back-biased condition. It is primarily in this back-biased condition that the diode acts as a variable capacitance. A back-biased potential across the diode causes the carriers to be pulled away from the depletion zone. The greater the potential applied in a back-biased direction across the diode, the further the carriers are pulled away from the depletion zone and the lower is the capacitance of the diode due to the effective larger width of the depletion zone.

A voltage multiplier 56 is provided to amplify the alternating signal developed by the amplifier 10 and the frequency-determining network 42 for developing an amplified or stepped-up voltage to control the capacitance of the diodes 46 and 48. The multiplying coil 58 is connected between the tap point 44 and a rectifier circuit 60, and is mutually coupled to the maintaining coil 32 as well as to the coil 24. Thus, the coils 24 and 58 are connected in a manner similar to an auto transformer with the tickler coil 32 mutually coupled thereto. A control lead 64 is provided to apply a D.C. control signal through an isolating resistor 66 to the junction point 52 to control the capacitance of the diodes 46 and 48. The isolating resistor 66 isolates the circuits which develop a D.C. control signal from the frequency-determining network 42.

The rectifier circuit 60 is a conventional full wave rectifier or voltage doubler which rectifies and doubles the voltage level of the alternating signal received from the multiplier coil 58. A first charging capacitor 68 has one end connected to receive the wave from the multiplier coil 58 by the lead 59 and the other end connected to a junction point 70. A diode 74 has its anode-to-cathode path connected between the junction point 70 and a lead 78 and a diode 76 has its cathode-to-anode path coupled between the junction point 70 and the ground lead 34. A second charging capacitor 82 is coupled between the lead 78 and the ground lead 34. As is well known, the rectifier 60 is response to a positive alternation on the lead 59 charges the second charging capacitor 82 through the diode 74 and in response to a negative alternation on the lead 59 charges the first charging capacitor 68 through the diode 76. The first charging capacitor 68 charges with a positive potential at the end connected to the junction point 70 and the second charging capacitor 82 charges with a positive potential at the end connected to the lead 78. Thus, the charges of the two capacitors 68 and 82 add to develop a D.C. control voltage on the lead 78 which is substantially twice the peak voltage of the alternating wave on the lead 59.

The D.C. control signal on the lead 78 is selectively adjusted in a sensing control circuit 86 and returned through the control lead 64 to the frequency-determining network 42 to provide tuning of the oscillator. The control circuit 86 includes potentiometers 88, 89 and 90 each having a resistor connected between the lead 78 and the ground lead 34 and each having a movable tap. The resistors of the potentiometers 88, 89 and 90 may be relatively large in value to avoid energy loss from the frequency-determining network 42. A selector switch 92 has a selector arm 93 movable between three terminals each of which is connected to one of the movable taps of the potentiometers 88, 89 and 90. The selector arm 93 is connected to the control lead 64 to apply the D.C. control voltage to the diodes 46 and 48 for tuning thereof. The potentiometers 88, 89 and 90 are shown as an example of the remote tuning control features of the oscillator. Each potentiometer may be in a different location to allow tuning from a plurality of positions, with the selector switch 92 utilized to determine which potentiometer is utilized for tuning. It is also to be recognized that a single tuning potentiometer may be utilized.

In operation, the parallel resonant circuit including the inductor coil 24 in parallel with the capacitance developed by the diodes 46 and 48 oscillates to form an alternating signal which is applied at the tap point 22 from the output coil 25 to the emitter of the transistor 18. The transistor 18 operates below its saturation region and develops on its collector an amplified alternating signal from the oscillating signal applied to the emitter from the output coil 25. The alternating signal applied to the emitter is reversed in phase from the signal on the collector of the transistor 18 because of the connection of the tap point 22. The parallel resonant circuit 24, 46, 48 is maintained in oscillation by regenerative energy fed back through the maintaining coil 32 to the coil 24. The alternating signal developed on the lead 27 may be applied to a mixer circuit to perform a heterodyning action.

The oscillating or alternating signal developed by the frequency-determining network 42 is received by the multiplying coil 58, amplified or stepped up a desired amount and passed through the rectifier 60 as the D.C. control signal. The voltage level of the D.C. control signal on the lead 78 is substantially doubled from the voltage level of the alternating signal developed by the multiplier 56. It is to be noted that energy feedback from the tickler coil 32 adds to the signal developed in the coils 24 and 58.

The D.C. control signal is then applied to a selected potentiometer such as 89 and fed back through the control lead 64 to the cathodes of the diodes 46 and 48. The selected potentiometer 89 controls the D.C. voltage to vary the capacitance of the diodes 46 and 48 concurrently so that the parallel resonant circuit may be tuned over a wide frequency band, such as a normal radio broadcast band. Both diodes 46 and 48 have their anodes substantially referenced to D.C. ground, the resistor 38 providing an insignificant voltage drop compared to the control bias applied to the junction point 52. An increase of D.C. voltage at the junction point 52, for example, increases the back bias on the diodes 46 and 48 to decrease the capacitance developed thereby and to increase the frequency of oscillation. Thus, the amplifying coil 58 in combination with the rectifier circuit 60 provides a self-developed high voltage D.C. source for tuning the oscillator, the entire circuit only requiring a single potential source such as the +6 volt battery 16 suitable for transistor circuitry. It is to be noted that the direct current control voltage applied to the lead 64 may be utilized for tuning a plurality of oscillators where a similar high voltage is required.

The feedback arrangement of this invention provides a self-developed control voltage with a minimum of energy loss, and thus does not impede the operation of the frequency-determining network 42. The only energy losses of the feedback arrangement are hysteresis losses in the coil 58, resistive losses in the rectifier circuit 60 and sensing control circuit 86 and charging current of the diodes 46 and 48. The resistors of the potentiometers 88, 89 and 90 have relatively large values so as to provide a minimum of current loss therethrough. Therefore, a highly efficient voltage tuned oscillator is provided by the circuit of this invention. Thus, there has been described an oscillator circuit suitable for use as a local oscillator in a conventional radio heterodyne receiver. The oscillator utilizes elements such as diodes having nonlinear capacitive characteristics which vary in response to changes of bias voltage, these diodes characteristically requiring relatively large changes of bias voltage for relatively small changes of capacitance. The diodes are relatively small compared to mechanical tuning capacitors and have the additional feature of providing simplified remote tuning. A high voltage control signal is developed from the resonant circuit of the oscillator to provide a wide range of bias voltage which is fedback to tune the resonant circuit over a wide range of frequency. Only a single low voltage power source as is conventionally utilized with transistor circuitry is required for both circuit operation and for tuning. Therefore, the circuit in accordance with this invention is highly useful in mobile or pocket radio receivers utilizing transistors where it is desirable to provide only a single low voltage power supply.

What is claimed is:

1. An oscillator comprising a potential source, a parallel resonant circuit for developing alternating waves and including a first inductor and a first and a second diode having a capacitance which varies nonlinearly with variation of an applied voltage, said first and second diodes being coupled in series to form a reactance circuit, said reactance circuit having one end coupled to said potential source and having the other end coupled to one end of said first inductor, the other end of said first inductor being coupled to said potential source, an amplifier circuit including a transistor having a base and a first electrode coupled to said potential source and having a second electrode coupled to said first inductor, a feedback coil coupled between said first electrode and said potential source and mutually coupled to said first inductor, a second inductor having one end coupled to said first inductor and mutually coupled to said first inductor, a rectifier circuit coupled between the other end of said second inductor and said potential source, and potentiometer means coupled between said rectifier circuit and said potential source and coupled to said reactance circuit for selectively controlling the capacitance thereof, whereby said second inductor amplifies the alternating wave to control the voltage applied to said first and second diodes from a single potential source.

2. A circuit comprising a potential source, a resonant circuit for developing alternating energy including a first inductor having one end coupled to said potential source and including a first and a second diode each having a capacitance which varies nonlinearly with variation of an applied voltage, said first diode having an anode coupled to the other end of said first inductor and having a cathode coupled to the cathode of said second diode, said second diode having an anode coupled to said potential source, an amplifier circuit coupled to said potential source and coupled to said first inductor for amplifying said alternating energy to develop an output wave and for passing a portion of the amplified energy thereto for maintaining said alternating energy, a second inductor having one end coupled to the other end of said first inductor for amplifying said alternating energy, rectifier means coupled between the other end of said second inductor and said potential source for developing direct current, control means coupled between said rectifier means and said potential source and coupled to the cathodes of said first and second diodes for controlling the capacitance of said diodes and for varying the frequency of said alternating wave.

3. An oscillator circuit comprising a resonant circuit for developing alternating signals and including a first inductor and first and second diodes having a capacitance which varies nonlinearly with variation of an applied voltage, said first and second diodes coupled in series to form a reactance circuit, said reactance circuit coupled between one end of said first inductor and a source of potential, the other end of said first inductor being coupled to said source of potential, an amplifier circuit coupled to said first inductor, a feedback coil coupled between said amplifier circuit and said source of potential and mutually coupled to said first inductor, a second inductor having one end coupled to said first inductor and mutually coupled to said first inductor, rectifier means coupled between the other end of said second inductor and said source of potential, and control means coupled between said rectifier means and said source of potential and to said reactance circuit for selectively varying the capacitance thereof to vary the frequency of said oscillator.

References Cited in the file of this patent

UNITED STATES PATENTS

| | | |
|---|---|---|
| 1,560,183 | McCullough | Nov. 3, 1925 |
| 2,182,377 | Guanella | Dec. 5, 1939 |
| 2,243,921 | Rust et al. | June 3, 1941 |
| 2,880,321 | Sontheimer | Mar. 31, 1959 |
| 2,936,428 | Schweitzer | May 10, 1960 |

OTHER REFERENCES

Wireless World, August 1956, pages 354, 355, "Junction Diode A.F.C. Circuit," Johnstone, 331–36.